(12) United States Patent
Dehe (10) Patent No.: US 10,397,709 B2
(45) Date of Patent: Aug. 27, 2019

(54) MICROELECTROMECHANICAL MICROPHONE

(71) Applicant: Infineon Technologies AG, Neubiberg (DE)

(72) Inventor: Alfons Dehe, Villingen Schwenningen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/876,239

(22) Filed: Jan. 22, 2018

(65) Prior Publication Data
US 2018/0213334 A1  Jul. 26, 2018

(30) Foreign Application Priority Data

Jan. 23, 2017 (DE) .......... 10 2017 101 195

(51) Int. Cl.

| | |
|---|---|
| *H04R 9/00* | (2006.01) |
| *H04R 29/00* | (2006.01) |
| *H04R 19/04* | (2006.01) |
| *H04R 7/12* | (2006.01) |
| *H04R 7/18* | (2006.01) |
| *H04R 7/20* | (2006.01) |
| *B81B 3/00* | (2006.01) |

(Continued)

(52) U.S. Cl.
CPC ............. *H04R 19/04* (2013.01); *B81B 3/007* (2013.01); *H04R 7/12* (2013.01); *H04R 7/18* (2013.01); *H04R 7/20* (2013.01); *B81B 3/0021* (2013.01); *B81B 2201/0257* (2013.01); *B81B 2203/0127* (2013.01); *B81B 2203/04* (2013.01); *H04R 7/24* (2013.01); *H04R 19/005* (2013.01); *H04R 2201/003* (2013.01)

(58) Field of Classification Search
CPC ........ H04R 19/04; H04R 19/005; H04R 9/00; H04R 29/003; H04R 2209/00; H04R 2209/41
USPC ......................................... 381/174–175, 404
See application file for complete search history.

(56) References Cited

U.S. PATENT DOCUMENTS

| | | | |
|---|---|---|---|
| 8,705,777 B2 * | 4/2014 | Je ............................. | H04R 1/00 381/174 |
| 9,409,763 B2 | 8/2016 | Dehe et al. | |

(Continued)

FOREIGN PATENT DOCUMENTS

DE   102012216150 A1   3/2013

*Primary Examiner* — Suhan Ni
(74) *Attorney, Agent, or Firm* — Viering, Jentschura & Partner MBB (57) ABSTRACT

A microelectromechanical microphone includes a planar first electrode that is formed, at least in portions, from an electrically conductive material, a planar second electrode that is formed, at least in portions, from an electrically conductive material and that is arranged at a distance from the first electrode, a spacer that is arranged between the first electrode and the second electrode, and a membrane that is arranged in a space defined between the first electrode and the second electrode and that is displaceable in the direction of at least one of the first electrode or the second electrode. The membrane has a membrane passage opening through which the spacer extends. The space defined between the first and the second electrode, in which the membrane is arranged, has a gas exchange connection with the surroundings of the microphone.

19 Claims, 4 Drawing Sheets

(51) Int. Cl.
   *H04R 19/00*    (2006.01)
   *H04R 7/24*    (2006.01)

(56) References Cited

U.S. PATENT DOCUMENTS

2013/0062710 A1    3/2013    Dehe
2014/0210020 A1    7/2014    Dehe
2015/0289046 A1   10/2015    Dehe et al.

* cited by examiner

MICROELECTROMECHANICAL MICROPHONE

CROSS-REFERENCE TO RELATED APPLICATION

This application claims priority to German Patent Application Serial No. 10 2017 101 195.1, which was filed Jan. 23, 2017, and is incorporated herein by reference in its entirety.

TECHNICAL FIELD

Various embodiments relate generally to a microelectromechanical microphone.

BACKGROUND

Microelectromechanical microphones have become very important in modern communication technology. A substantial challenge in the production of microelectromechanical microphones consists of producing the components thereof with a well-defined form and of arranging said components in a well-defined manner relative to one another. Here, a substantial problem arises from mechanical or thermal stresses, to which the microphone components are subjected and which may lead to the deformation of said components; this, in turn, makes well-defined relative positioning of the components of a microelectromechanical microphone more difficult.

Such stresses may have intrinsic causes and may be traced back to thermal and mechanical loads during the production process. Alternatively, or additionally, such stresses may only arise from the coupling of different components, for example from coupling a plurality of components which have different coefficients of thermal expansion from one another.

Therefore, in order to produce a microelectromechanical microphone with reproducible properties, it is necessary to minimize the mechanical stresses to which the components thereof are exposed.

SUMMARY

A microelectromechanical microphone includes a planar first electrode that is formed, at least in portions, from an electrically conductive material, a planar second electrode that is formed, at least in portions, from an electrically conductive material and that is arranged at a distance from the first electrode, a spacer that is arranged between the first electrode and the second electrode, and a membrane that is arranged in a space defined between the first electrode and the second electrode and that is displaceable in the direction of at least one of the first electrode or the second electrode. The membrane has a membrane passage opening through which the spacer extends. The space defined between the first and the second electrode, in which the membrane is arranged, has a gas exchange connection with the surroundings of the microphone.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
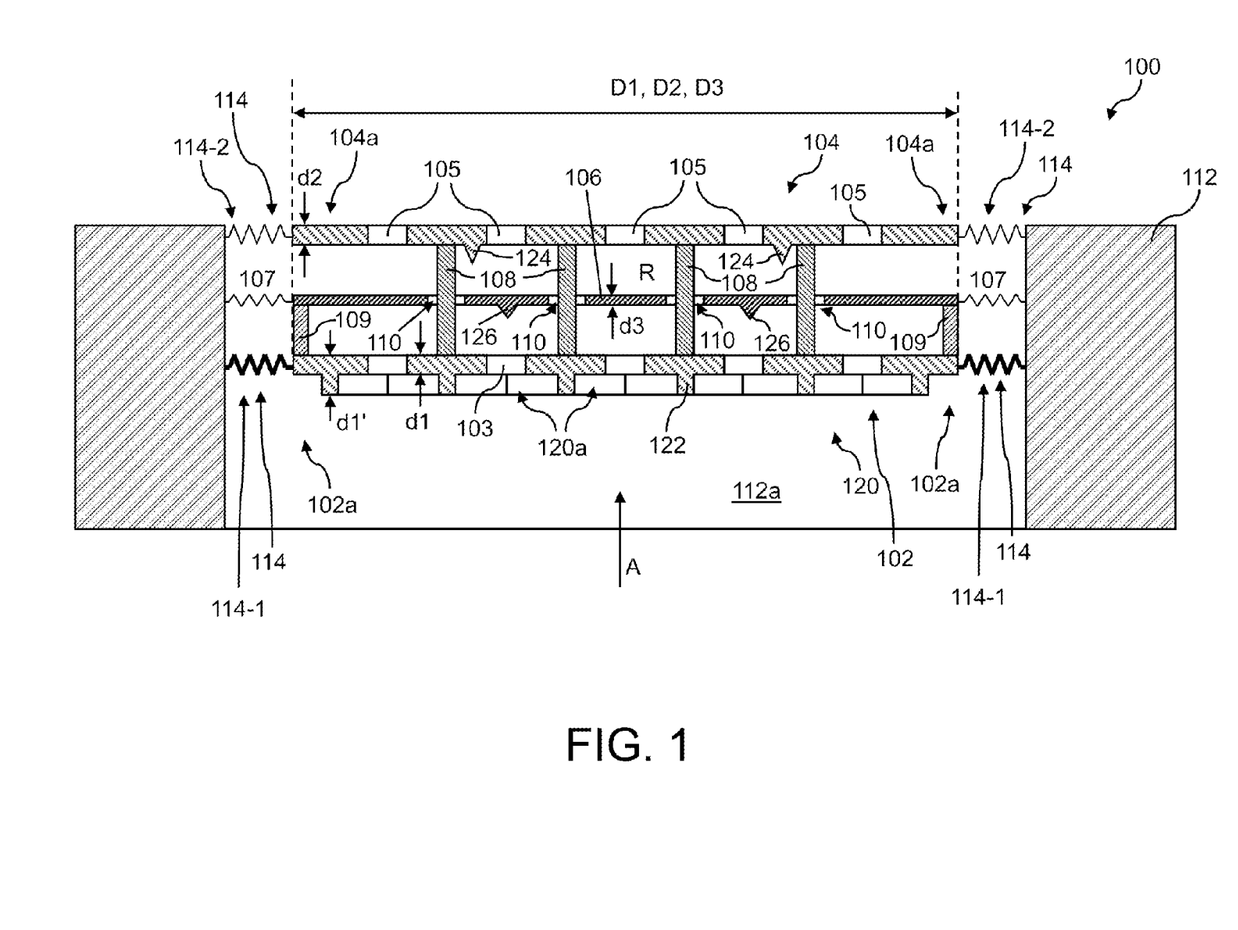
FIG. 1 shows a schematic cross sectional illustration of an exemplary microelectromechanical microphone.

FIG. 1 shows an exemplary microelectromechanical microphone 100. The microelectromechanical microphone 100 has a planar first electrode 102 and a planar second electrode 104 that is arranged at a distance from the first electrode 102.

By way of "planar", the present application denotes the geometry of a component which has a substantially greater extent in a first direction and in a second direction that is orthogonal to the first direction than in a third direction (thickness direction) that is orthogonal to the first and the second direction.

The first electrode 102 and the second electrode 104 are formed, at least in portions or even completely, from an electrically conductive material, for instance from a metal or from a polycrystalline semiconductor material, e.g. silicon.

The first electrode 102 or/and the second electrode 104 may have thicknesses $d1$ and $d2$, respectively, of less than 1 µm, optionally of less than 500 nm, further optionally of less than 250 nm. The diameters $D1$ and $D2$ of the first electrode 102 and the second electrode 104, respectively, may be less than 1 mm, optionally less than 750 µm, further optionally less than 500 µm. Even though the first electrode 102 and the second electrode 104 of the exemplary microphone 100 shown in FIG. 1 are shown with substantially the same diameter, this is naturally not mandatory. This special illustration in FIG. 1 has only been selected for reasons of simplicity.

Moreover, the microphone 100 has a membrane 106 that is arranged in a space R defined between the first electrode 102 and the second electrode 104, said membrane being displaceable in the direction of the first electrode 102 or/and the second electrode 104 by soundwaves to be detected. The space R has a gas exchange connection with the surroundings of the microphone 100 in order to be able to ensure efficient input coupling of sound. A gas exchange connection between the space R and the surroundings of the microphone may be provided, for example, by a plurality of electrode passage openings 103 and 105 provided in the first electrode 102 or/and the second electrode 104. As a result of this, it is possible to ensure a gas pressure in the space R which is equal to the ambient pressure. By way of example, the electrode passage openings 103, 105 may have diameters of the order of 1 µm.

The membrane 106 may be formed, at least in portions or even completely, from an electrically conductive material, for example from a metal or from a polycrystalline semiconductor material, for instance polycrystalline silicon.

The membrane 106 has a diameter D3. It may be less than 1 mm, optionally less than 750 µm, further optionally less than 500 µm. Deviating from the illustration of FIG. 1, the diameter D3 of the membrane 106 may differ from the diameters D1 and D2 of the first electrode 102 and the second electrode 104. The thickness d3 of the membrane 106 may be less than the thicknesses d1 and d2 of the first electrode 102 and the second electrode 104. In various embodiments, the thickness d3 of the membrane 106 may be less than 500 nm, optionally less than 250 nm, further optionally less than 100 nm.

In the configuration shown in FIG. 1, the membrane 106 forms a first capacitor with the first electrode 102 and a second capacitor with the second electrode 104. Here, a displacement of the membrane 106 caused by soundwaves to be detected instigates a change in the capacitance of both the first capacitor and the second capacitor; these can be read using a suitable readout circuit. The change in capacitance induced thereby contains information about the soundwaves to be detected, for instance the sound pressure or the sound frequency.

The arrangement shown in FIG. 1 offers, for example, the option of a differential signal measurement, in which an electrical reference voltage is applied to the membrane 106 and in which electrical voltages with the same magnitude but with different signs relative to the reference voltage are applied to both the first electrode 102 and second electrode 104. By combining the signals measured between the membrane 106 and the first electrode 102 with the signals measured between the membrane 106 and the second electrode 104, for example by subtracting one signal from the other, it is possible to suppress common noise contributions and obtain a high degree of linearity.

Figure 2:
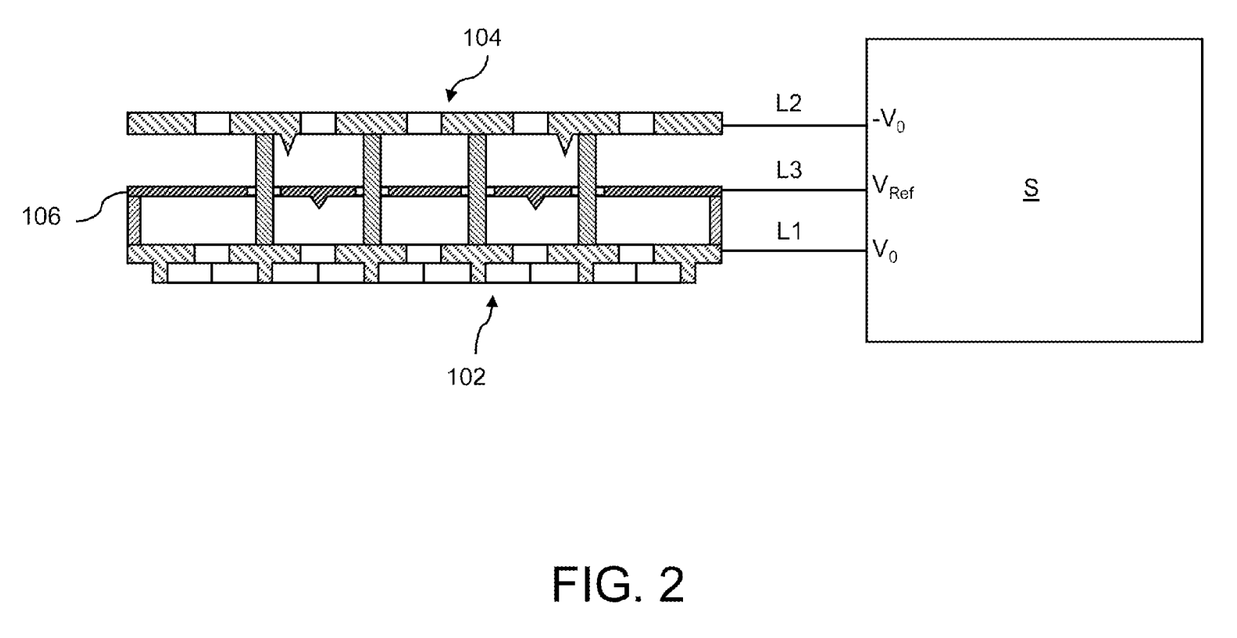
FIG. 2 shows a schematic wiring arrangement for operating the microphone shown in FIG. 1.

An exemplary wiring arrangement for electrically interconnecting the first electrode 102 and the second electrode 104 on the one hand and the membrane 106 on the other hand is shown in FIG. 2. As shown in FIG. 2, the microphone 100 may have a control unit S (for example, one or more control circuits, for example one or more processors), which is connected to the first electrode 102, the second electrode 104, and the membrane 106 via respective electrical lines L1, L2, L3 and which is configured to apply respective electrical voltages to the first electrode 102, to the second electrode 104, and to the membrane 106 and configured to ascertain the capacitance between the membrane 106 and the first electrode 102 or/and ascertain the capacitance between the membrane 106 and the second electrode 104. By way of example, the control unit S can be configured to apply an electrical reference voltage $V_{Ref}$ to the membrane 106 and apply electrical voltages that differ from one another to the first electrode 102 and to the second electrode 104. As shown in FIG. 2, a voltage $V_0$ can be applied to the first electrode 102 and a voltage $-V_0$ with the same magnitude can be applied to the second electrode 104 (i.e. voltages with the same magnitude but opposite sign). As a result of this, it is possible to realize the differential measuring scheme described above.

A precise sound measurement can be obtained, for example, when the first electrode 102 and the second electrode 104 have a well-defined distance from one another so as to define a well-defined capacitor geometry. A well-defined distance between the first electrode 102 and the second electrode 104 can be provided by at least one spacer 108, or by a plurality of spacers, between the first electrode 102 and the second electrode 104.

A plurality of spacers 108 are provided in the microphone 100 shown in FIG. 1. The membrane 106 has a plurality of membrane passage openings 110, through which one spacer 108 extends in each case. As a result of this, it is possible, in principle, to provide a spacer 108 in a portion of the first electrode 102 or/and the second electrode 104 that differs from an edge region in order, thereby, to be able to set a defined distance in a central region of the first electrode 102 and the second electrode 104. If, as shown in FIG. 1, a plurality of spacers 108 are provided, it is possible to provide a fine-meshed spacer arrangement, with the aid of which it is possible to set the distance between the first electrode 102 and the second electrode 104 accurately over the entire extent of the first electrode 102 or/and the second electrode 104. The distances between adjacent spacers 108 may be approximately 10 to 100 µm, for example 25 to 75 µm, for instance approximately 40 to 60 µm.

A membrane passage opening 110 can be an opening that is provided in a continuous manner in the membrane 106 in the thickness direction thereof, said opening being delimited on all sides by membrane material in the plane of the membrane.

At least one of the spacers 108, optionally a plurality of the spacers 108, further optionally all spacers 108, may have permanent physical contact with the first electrode 102 or/and the second electrode 104. In various embodiments, at least one spacer 108, optionally plurality of the spacers 108, further optionally all spacers 108, may have an integral connection to the first electrode 102 or/and the second electrode 104. As a result of this, it is possible to keep the distance between the first electrode 102 and the second electrode 104 constant as bending of the first electrode 102 or/and the second electrode 104 toward the respective other electrode and away from the latter can be effectively prevented.

At least one spacer 108, a plurality of the spacers 108, or even all spacers 108, may be produced from an electrically insulating material, for instance from $SiO_2$ or $Si_3N_4$, or from a combination of an electrically insulating material with an electrically conductive material, for instance a metal or a polycrystalline semiconductor material, e.g. polycrystalline silicon, as a result of which the capacitive coupling between the first electrode 102 and the second electrode 104 is reducible, said capacitive coupling otherwise possibly being problematic since the first electrode 102 and the second electrode 104 lie at different electrical potentials.

Within the meaning of this application, an electrically conductive material can be a material with an electrical conductivity of more than 10 S/m, for example more than $10^2$ S/m or more than $10^4$ S/m, or even more than $10^6$ S/m. Within the meaning of this application, an electrically insulating material can be a material with an electrical conductivity of less than $10^{-2}$ S/m, for example less than $10^{-5}$ S/m or even less than $10^{-7}$ S/m.

If a spacer 108 is formed, in portions, from an electrically conductive material, it can be used as part of an electrical supply line to the first electrode 102 or the second electrode 104.

In order not to impair the displaceability of the membrane 106 toward the first electrode 102 or/and the second electrode 104, provision can be made for at least one spacer 108, a plurality of the spacers 108, or even all spacers, to extend without contact through the membrane passage openings 110 in each case. In various embodiments, the membrane 106 does not contact the spacers 108 in any of its positions.

As a result of this, it is possible to ensure a high linearity of the microphone response to soundwaves to be detected.

The diameter of a spacer 108 can be approximately 1 to 5 μm. The diameter of a membrane passage opening 110 can be greater, by 10% to 100%, optionally by 25% to 75%, further optionally by 40% to 60%, than the diameter of a spacer 108 extending through the relevant membrane passage opening 110. Naturally, the relationships above may apply to a plurality of membrane passage openings 110 or even to all membrane passage openings 110 and the spacers 108 extending therethrough. As a result of these diameters, it is possible to restrict an airflow through the membrane passage openings 110 in the case of a displacement of the membrane 106, which in turn restricts the noise contributions caused by the airflow.

Further, as shown in FIG. 1, the microphone 100 may have a holder 112, at which the first electrode 102 and the second electrode 104 can be held in a resilient manner by a spring arrangement 114. The holder 112 can have a ring-like or ring-segment-like form. The spring arrangement 114 may be connected, optionally connected in an integral manner, to an inner circumference region 112a of the holder 112. The spring arrangement 114 may be connected, optionally connected in an integral manner, to an outer circumference region 102a of the first electrode 102 or/and an outer circumference region 104a of the second electrode 104.

As indicated in FIG. 1, the spring arrangement 114 may have a first spring arrangement 114-1, by means of which the first electrode 102 is held in a resilient manner at the holder 112, and a second spring arrangement 114-2, which differs from the first spring arrangement 114-1 and by means of which the second electrode 104 is held in a resilient manner at the holder 112. The first spring arrangement 114-1 and the second spring arrangement 114-2 may have spring constants that differ from one another. In the exemplary microphone 100 shown in FIG. 1, the second spring arrangement 114-2 may have a smaller spring constant than the first spring arrangement 114-1, which is indicated by the different thicknesses of the lines used to represent the first spring arrangement 114-1 and the second spring arrangement 114-2. As a result of this, it is possible, for example, to largely mechanically decouple the second electrode 104 from the holder 112, for example to prevent a thermally caused mechanical load on the second electrode 104 by the holder 112, as may occur, for example, if the holder 112 and the second electrode 104 are formed from different materials with different coefficients of thermal expansion.

Improved decoupling of the second electrode 104 from the holder 112 in comparison therewith may be provided if the second spring arrangement 114-2 is dispensed with entirely. In a microphone 100 embodied in such a way, the second electrode 104 is held at the first electrode 102 by means of the spacers 108 only. In such an embodiment, the spring arrangement 114 may be identical to the first spring arrangement 114-1.

Figure 3:
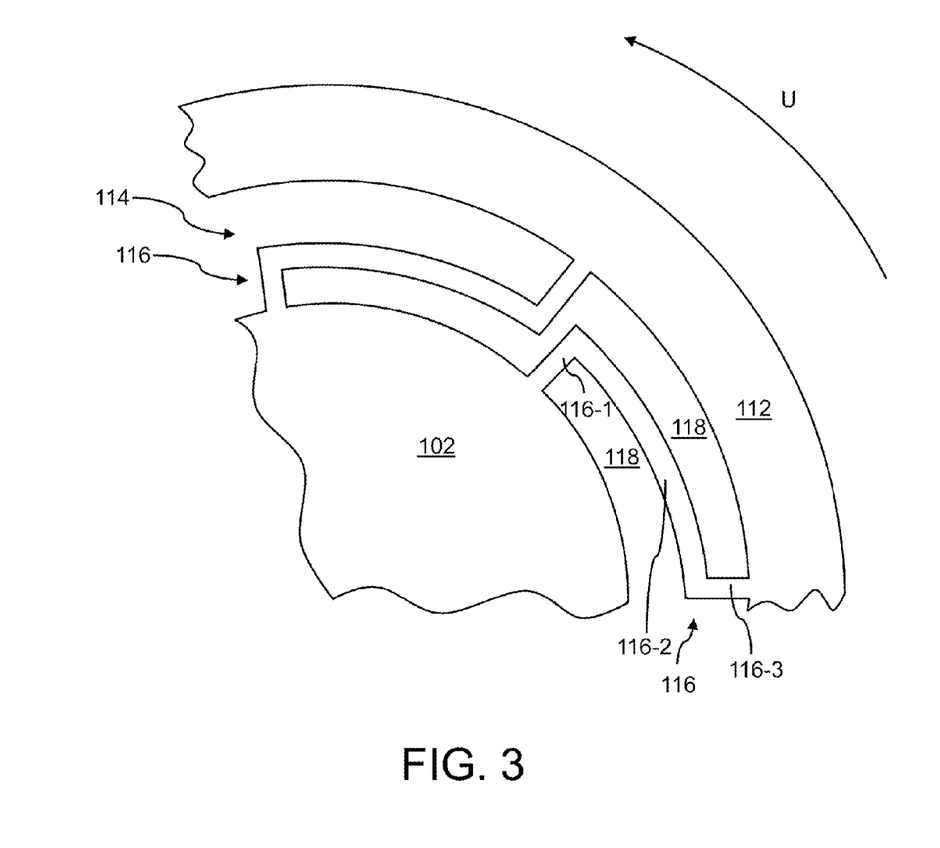
FIG. 3 shows a schematic view of a spring arrangement between an electrode and a holder.

An exemplary spring arrangement 114 is shown in FIG. 3. It may be provided between the first electrode 102 and the holder 112. Consequently, in the microphone shown in FIG. 1, it corresponds to the first spring arrangement 114-1. Naturally, the second electrode 104 may also be coupled to the holder 112 using a second spring arrangement 114-2, which may have a similar structure to the spring arrangement 114 shown in FIG. 3. For reasons of simplicity, it is implied in the following description that the electrode shown in FIG. 3 is the first electrode 102.

The spring arrangement 114 may have a plurality of spring arrangement segments 116, which are arranged in succession in the circumferential direction U. As indicated in FIG. 3, the spring arrangement segments 116 may have an identical structure.

A spring arrangement segment 116, or each spring arrangement segment, may have: an electrode connection web 116-1 that is connected to the first electrode 102, an intermediary connection web 116-2 that is connected to the electrode connection web 116-1 and that extends in the circumferential direction U, and a holder connection web 116-3 that is connected to the intermediary connection web 116-2 and the holder 112. The intermediary connection web 116-2 may have a ring-segment-type design and may be arranged in the radial interstice between the first electrode 102 and the holder 112.

As shown in FIG. 3, the electrode connection web 116-1 and the holder connection web 116-3 may be offset from one another in the circumferential direction U and may have a smaller extent in the circumferential direction U than the intermediary connection web 116-2. As a result of this, it is possible, for example, to form air passage openings 118 between the first electrode 102 and the holder 112, by means of which the space R that is formed between the first electrode 102 and the second electrode 104 may have a gas exchange connection with the surroundings of the microphone 100. The electrode connection web 116-1 and the holder connection web 116-3 may be connected to ends of the intermediary connection web 116-2 that are opposite to one another in the circumferential direction U.

The exemplary spring arrangement 114 shown in FIG. 3 is suitable, for example, for forming the spring arrangement 114 in integral manner with the both the relevant electrode 102 and with the holder 112.

As indicated in FIG. 1, the membrane 106 may also be held in a resilient manner at the holder 112 by means of spring elements 107. The spring elements 107 can be edge portions of the membrane 106 and have a substantially lower spring constant than the spring arrangement 114 in order to ensure a high membrane displaceability. As shown in FIG. 1, the membrane 106 may be carried, moreover, by a support element 109 at the first electrode 102. The support element 109 may have a substantially ring-like form. The support element 109 may be formed from an oxide, for instance $SiO_2$.

In order to be able to avoid deformations of the first electrode 102 or/and the second electrode 104 caused by stress, it is possible for the first electrode 102 or/and the second electrode 104 to have a reinforcement structure. Only the first electrode 102 is provided with a reinforcement structure 120 in the exemplary microphone 100 shown in FIG. 1. As a result of this, it is possible to provide the first electrode 102 with a high rigidity and the latter is therefore particularly suitable as a carrier for the second electrode 104 which, in various embodiments, is mechanically coupled to the holder 112 in a weaker manner compared to the first electrode 102, or not at all.

The reinforcement structure 120 may have a plurality of reinforcement structure unit cells 120a. A plan view of a portion of the reinforcement structure 120 of the first electrode 102 when viewing the first electrode 102 from the direction indicated in FIG. 1 by reference sign A is shown in FIG. 4.

Figure 4:
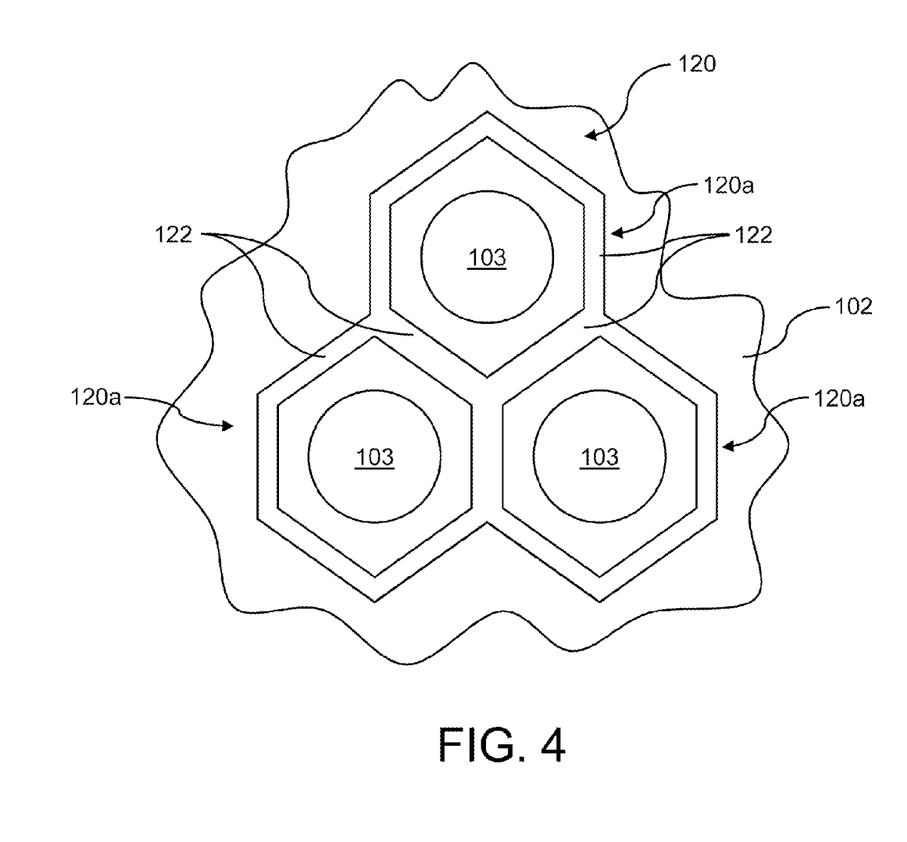
FIG. 4 shows a schematic view of a portion of a reinforcement structure of an electrode.

As shown in FIG. 4, at least one reinforcement structure unit cell 120a may be defined by a closed surrounding wall 122. The wall 122 may have a polygonal form, for instance a hexagonal form. As a result of this, the reinforcement structure 120 can be constructed without gaps from a plurality of identical reinforcement structure unit cells 120a.

Further, at least one reinforcement structure unit cell 120*a* can surround an electrode passage opening 103. In the microphone 100 shown in the figures, the reinforcement structure unit cells 120*a* in each case surround a single electrode passage opening 103. As a result of this configuration, it is possible to provide a mechanically stable first electrode 102, as this ensures that a wall 122 extends in the region between any two electrode passage openings 103, as a result of which the material weakening of the first electrode 102 caused by the electrode passage openings 103 can be compensated by the wall 122.

The first electrode 102 may have a thickness d1' in the region of the walls 122, said thickness being greater than the thickness d1 in regions of the first electrode 102 that differ from the walls 122. By way of example, it can assume values in the range between 1 and 50 μm, for example between 10 and 40 μm, for instance between 20 and 30 μm.

As shown in FIG. 1, the second electrode 104 may have a plurality of electrode anti-adhesion projections 124 that point toward the membrane 106. As a result of this, it is possible to prevent an adhesion of the membrane 106 at the second electrode 104 in the case of relatively large deflections of the membrane 106 in the direction of the second electrode 104. At least one of the electrode anti-adhesion projections 124 may taper in the direction of the membrane 106. An adhesion of the membrane 106 at the second electrode 104 can be prevented particularly effectively by way of this form since the contact area is very small in the case of contact between the membrane 106 and the second electrode 104.

Naturally, the first electrode 102 may also be provided with at least one electrode anti-adhesion projection that points toward the membrane 106, or with a plurality of such electrode anti-adhesion projections. The electrode anti-adhesion projections provided at the first electrode may also have a form that tapers in the direction of the membrane 106.

As shown in FIG. 1, the membrane 106 may have a plurality of membrane anti-adhesion projections 126 which point toward the first electrode 102. With the membrane anti-adhesion projections 126, it is possible to obtain substantially the same effect as with the electrode anti-adhesion projections 124. The membrane anti-adhesion projections 126 may have a form that tapers in the direction of the first electrode 102.

Alternatively, or additionally, the membrane 106 may have at least one membrane anti-adhesion projection that points toward the second electrode 104. Naturally, a plurality of such membrane anti-adhesion projections are likewise conceivable.

A microphone 100 as described above may be part of a mobile apparatus. A mobile apparatus may be an apparatus which can be carried by a person without further auxiliary means. By way of example, such a mobile apparatus may be embodied as a cellular telephone, as a tablet or as a laptop, or may have a cellular telephone, a tablet or a laptop.

Now, numerous examples of the present disclosure are described below.

Example 1 is a microelectromechanical microphone, which has: a planar first electrode that is formed, at least in portions, from an electrically conductive material, a planar second electrode that is formed, at least in portions, from an electrically conductive material and that is arranged at a distance from the first electrode, a spacer that is arranged between the first electrode and the second electrode, and a membrane that is arranged in a space defined between the first electrode and the second electrode and that is displaceable in the direction of the first electrode or/and the second electrode, said membrane having a membrane passage opening through which the spacer extends, wherein the space defined between the first and the second electrode, in which the membrane is arranged, has a gas exchange connection with the surroundings of the microphone.

In example 2, the subject matter of example 1 may optionally further include that the diameter of the membrane passage opening is greater, by 10% to 100%, optionally by 25% to 75%, further optionally by 40% to 60%, than the diameter of the spacer that extends through the membrane passage opening.

In example 3, the subject matter of the example 1 or 2 may optionally further include that the spacer extends through the membrane passage opening in a contactless manner in at least one membrane position, optionally in all membrane positions.

In example 4, the subject matter of any one of examples 1 to 3 may optionally further include a plurality of spacers between the first electrode and the second electrode.

In example 5, the subject matter of example 4 may optionally further include that the membrane has a plurality of membrane passage openings, through which a spacer extends in each case.

In example 6, the subject matter of any one of examples 1 to 5 may optionally further include that at least one spacer, optionally a plurality of spacers, further optionally all spacers, has or have permanent physical contact with the first electrode or/and the second electrode.

In example 7, the subject matter of example 6 may optionally further include that at least one spacer, optionally a plurality of spacers, further optionally all spacers, has or have an integral embodiment with the first electrode or/and the second electrode.

In example 8, the subject matter of any one of examples 1 to 7 may optionally further include that at least one spacer, optionally a plurality of spacers, further optionally all spacers, is or are formed from an electrically insulating material or/and an electrically conductive material.

In example 9, the subject matter of example 8 may optionally further include that at least one spacer that is formed, at least in portions, from an electrically conductive material forms a part of an electrical supply line to the first electrode or/and the second electrode.

In example 10, the subject matter of any one of examples 1 to 9 may optionally further include a holder, at which at least one of the first electrode and the second electrode, optionally the first electrode and the second electrode, is/are held in a resilient manner by means of a spring arrangement.

In example 11, the subject matter of example 10 may optionally further include that the holder has a ring-like or ring-segment-like form with an inner circumference region to which the spring arrangement is connected, optionally in an integral manner.

In example 12, the subject matter of example 10 or 11 may optionally further include that the spring arrangement is connected to an outer circumference region of the first electrode or/and the second electrode, optionally in an integral manner.

In example 13, the subject matter of either of examples 11 and 12 may optionally further include that the spring arrangement has at least one spring arrangement segment, the latter being able to have: an electrode connection web connected to the first electrode or/and the second electrode, an intermediary connection web, optionally a ring-segment-type intermediary connection web, that is connected to the electrode connection web and that extends in the circumferential direction of the holder, and a holder connection web that is connected to the intermediary connection web and the holder.

In example 14, the subject matter of example 13 may optionally further include that the electrode connection web or/and the holder connection web has or have a smaller extent in the circumferential direction than the intermediary connection web, wherein, optionally, the electrode connection web and the holder connection web are offset in relation to one another in the circumferential direction.

In example 15, the subject matter of example 13 or 14 may optionally further include a plurality of spring arrangement segments, which are optionally arranged in succession in the circumferential direction.

In example 16, the subject matter of any one of examples 10 to 15 may optionally further include that the spring arrangement has: a first spring arrangement, by means of which the first electrode is held in a resilient manner at the holder, and a second spring arrangement that is different from the first spring arrangement and by means of which the second electrode is held in a resilient manner at the holder.

In example 17, the subject matter of example 16 may optionally further include that the first spring arrangement and the second spring arrangement have spring constants that differ from one another.

In example 18, the subject matter of any one of examples 10 to 15 may optionally further include that only one of the first electrode and the second electrode is connected to the holder by means of the spring arrangement, wherein, optionally, the respective other one from the first electrode and the second electrode is held by means of the spacer at the electrode that is held in a resilient manner at the holder by means of the spring arrangement.

In example 19, the subject matter of any one of examples 1 to 18 may optionally further include that the first electrode or/and the second electrode has or have a reinforcement structure.

In example 20, the subject matter of claim 19 may optionally further include that the reinforcement structure has a plurality of reinforcement structure unit cells.

In example 21, the subject matter of example 20 may optionally further include that at least one reinforcement structure unit cell, optionally a plurality of reinforcement structure unit cells, further optionally all reinforcement structure unit cells, is/are defined by a closed circumferential wall, wherein the wall is embodied with a polygonal form, for instance a hexagonal form.

In example 22, the subject matter of any one of examples 1 to 21 may optionally further include that the first electrode or/and the second electrode has or have at least one electrode passage opening, optionally a plurality of electrode passage openings.

In example 23, the subject matter of examples 21 and 22 may further optionally include that the wall of at least one reinforcement structure unit cell surrounds an electrode passage opening, optionally wherein the walls of a plurality of reinforcement structure unit cells surround an electrode passage opening in each case, further optionally wherein the wall of each reinforcement structure unit cell surrounds an electrode passage opening.

In example 24, the subject matter of any one of examples 1 to 23 may further optionally include that the first electrode or/and the second electrode has or have at least one electrode anti-adhesion projection that points to the membrane, optionally a plurality of electrode anti-adhesion projections that point to the membrane.

In example 25, the subject matter of example 24 may optionally further include that the at least one electrode anti-adhesion projection, optionally the plurality of electrode anti-adhesion projections, further optionally all electrode anti-adhesion projections, tapers or taper in the direction toward the membrane.

In example 26, the subject matter of any one of examples 1 to 25 may optionally further include that the membrane has at least one membrane anti-adhesion projection that points to the first electrode or to the second electrode, optionally a plurality of membrane anti-adhesion projections that point to the first electrode or/and the second electrode.

In example 27, the subject matter of example 25 may optionally further include that the at least one membrane anti-adhesion projection, optionally the plurality of membrane anti-adhesion projections, further optionally all membrane anti-adhesion projections, tapers or taper with increasing distance from the membrane.

In example 28, the subject matter of any one of examples 1 to 27 may optionally further include a control unit which is configured to apply an electric voltage to the first electrode, to the second electrode, and to the membrane in each case and which is configured to ascertain a capacitance between the membrane and the first electrode and a capacitance between the membrane and the second electrode.

In example 29, the subject matter of example 28 may optionally further include that the control unit is configured to apply an electrical reference voltage to the membrane and to apply, relative to the reference voltage, mutually different electrical voltages to the first electrode and to the second electrode, optionally to apply electrical voltages of the same magnitude but different or opposite sign (polarity) relative to the reference voltage.

Example 30 is a mobile apparatus, including a microelectromechanical microphone according to any one of examples 1 to 29.

In example 31, the mobile apparatus of example 30 is optionally configured as a cellular telephone.

A microelectromechanical microphone with well-defined properties is provided according to various embodiments.

According to various embodiments, a microelectromechanical microphone is provided. The microelectromechanical microphone may include a planar first electrode that is formed, at least in portions, from an electrically conductive material, a planar second electrode that is formed, at least in portions, from an electrically conductive material and that is arranged at a distance from the first electrode, a spacer that is arranged between the first electrode and the second electrode, and a membrane that is arranged in a space defined between the first electrode and the second electrode and that is displaceable in the direction of the first electrode or/and the second electrode, said membrane having a membrane passage opening through which the spacer extends. The space defined between the first and the second electrode, in which the membrane is arranged, has a gas exchange connection with the surroundings of the microphone.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A microelectromechanical microphone, comprising:
a planar first electrode that is formed, at least in portions, from an electrically conductive material,
a planar second electrode that is formed, at least in portions, from an electrically conductive material and that is arranged at a distance from the first electrode,
a spacer that is arranged between the first electrode and the second electrode, and
a membrane that is arranged in a space defined between the first electrode and the second electrode and that is displaceable in a direction of at least one of the first electrode or the second electrode, the membrane comprising a membrane passage opening through which the spacer extends;
a holder, at which at least one of the first electrode or the second electrode is held in a resilient manner by a spring arrangement,
wherein the space defined between the first and the second electrode, in which the membrane is arranged, has a gas exchange connection with surroundings of the microphone.

2. The microelectromechanical microphone of claim 1, wherein a diameter of the membrane passage opening is greater, by 10% to 100% than a diameter of the spacer that extends through the membrane passage opening.

3. The microelectromechanical microphone of claim 1, wherein the spacer extends through the membrane passage opening in a contactless manner in at least one membrane position, optionally in all membrane positions.

4. The microelectromechanical microphone of claim 1, further comprising:
a plurality of spacers between the first electrode and the second electrode.

5. The microelectromechanical microphone of claim 4, wherein the membrane has a plurality of membrane passage openings, through which a spacer extends in each case.

6. The microelectromechanical microphone of claim 1, wherein at least one spacer, has permanent physical contact with at least one of the first electrode or the second electrode.

7. The microelectromechanical microphone of claim 6, wherein at least one spacer has an integral embodiment with at least one of the first electrode or the second electrode.

8. The microelectromechanical microphone of claim 1, wherein at least one spacer is formed from at least one of an electrically insulating material or an electrically conductive material.

9. The microelectromechanical microphone of claim 8, wherein at least one spacer that is formed, at least in portions, from an electrically conductive material forms a part of an electrical supply line to at least one of the first electrode or the second electrode.

10. The microelectromechanical microphone of claim 1, wherein the holder has a ring-like or ring-segment-like form with an inner circumference region to which the spring arrangement is connected.

11. The microelectromechanical microphone of claim 1, wherein the spring arrangement is connected to an outer circumference region of at least one of the first electrode or the second electrode.

12. The microelectromechanical microphone of claim 10, wherein the spring arrangement has at least one spring arrangement segment, the latter comprising:
an electrode connection web connected to the first electrode or/and the second electrode,
an intermediary connection web that is connected to the electrode connection web and that extends in a circumferential direction, and
a holder connection web that is connected to the intermediary connection web and the holder.

13. The microelectromechanical microphone of claim 12, further comprising:
a plurality of spring arrangement segments, which are optionally arranged in succession in the circumferential direction.

14. The microelectromechanical microphone of claim 1, wherein the spring arrangement comprises:
a first spring arrangement, by which the first electrode is held in a resilient manner at the holder, and
a second spring arrangement that is different from the first spring arrangement and by which the second electrode is held in a resilient manner at the holder.

15. The microelectromechanical microphone of claim 1, wherein at least one of the first electrode or the second electrode has a reinforcement structure.

16. The microelectromechanical microphone of claim 1, wherein at least one of the first electrode or the second electrode has at least one electrode passage opening.

17. The microelectromechanical microphone of claim 1, wherein at least one of the first electrode or the second electrode has at least one electrode anti-adhesion projection that points to the membrane.

18. The microelectromechanical microphone of claim 1, wherein the membrane has at least one membrane anti-adhesion projection that points to the first electrode or to the second electrode.

19. The microelectromechanical microphone of claim 1, further comprising:
a control unit which is configured to apply an electric voltage to the first electrode, to the second electrode, and to the membrane in each case and which is configured to ascertain a capacitance between the membrane and the first electrode and a capacitance between the membrane and the second electrode.

* * * * *